United States Patent [19]
Kim et al.

[11] Patent Number: 5,767,574
[45] Date of Patent: Jun. 16, 1998

[54] SEMICONDUCTOR LEAD FRAME

[75] Inventors: Joong-do Kim; Young-ho Baek, both of Yongin, Rep. of Korea

[73] Assignee: Samsung Aerospace Industries, Ltd., Kyongsangnam-do, Rep. of Korea

[21] Appl. No.: 792,211

[22] Filed: Jan. 31, 1997

[30] Foreign Application Priority Data

Mar. 26, 1996 [KR] Rep. of Korea .................. 1996-8361

[51] Int. Cl.⁶ .................. H01L 23/495; H01L 23/48; B05D 3/00; B05D 3/12
[52] U.S. Cl. .................. 257/677; 257/766; 257/748; 257/768; 427/328
[58] Field of Search .................. 257/677

[56] References Cited

U.S. PATENT DOCUMENTS

| | | | |
|---|---|---|---|
| 3,648,355 | 3/1972 | Shida et al. | 29/199 |
| 4,141,029 | 2/1979 | Dromsky | 257/677 |
| 4,441,118 | 4/1984 | Fister et al. | 257/677 |
| 4,486,511 | 12/1984 | Chen et al. | 428/620 |
| 4,529,667 | 7/1985 | Shiga et al. | 428/646 |
| 4,894,752 | 1/1990 | Murata et al. | 257/666 |
| 5,001,546 | 3/1991 | Butt | 257/677 |
| 5,138,431 | 8/1992 | Huang et al. | 257/677 |
| 5,221,859 | 6/1993 | Kobayashi et al. | 257/676 |
| 5,360,991 | 11/1994 | Abys et al. | 257/666 |
| 5,454,929 | 10/1995 | Kinghorn | 205/128 |
| 5,510,197 | 4/1996 | Takahashi et al. | 428/670 |
| 5,561,320 | 10/1996 | Abbott et al. | 257/677 |
| 5,618,576 | 4/1997 | Baek | 427/96 |
| 5,650,661 | 7/1997 | Mathew | 257/677 |
| 5,684,329 | 11/1997 | Serizawa | 257/677 |
| 5,710,456 | 1/1998 | Abbott et al. | 257/677 |

*Primary Examiner*—Mahshid D. Saadat
*Assistant Examiner*—Jhihan B. Clark
*Attorney, Agent, or Firm*—Finnegan, Henderson, Farabow, Garrett & Dunner, L.L.P.

[57] ABSTRACT

A semiconductor lead frame having an improved structure formed of plated layers is provided. The semiconductor lead frame has the structure of multi-plated layers in which a Ni plated layer, a Pd strike plated layer, and a Pd—X alloy plated layer are deposited on a substrate in the described order. In such a multi-plated layer structure, the Pd strike plated layer covers the porous surface of the Ni plated layer and decreases the surface roughness. Since the thickness of the outer Pd—X alloy plated layer can be maintained uniform due to the Pd strike plated layer, corrosion durability and bonding characteristics are enhanced, thus minimizing the generation and progress of cracks.

9 Claims, 3 Drawing Sheets

SEMICONDUCTOR LEAD FRAME

BACKGROUND OF THE INVENTION

The present invention relates to a semiconductor lead frame, and more particularly, to a semiconductor lead frame having improved wire bonding and die attachment characteristics resulting from an improved multi-plated layer structure.

The semiconductor lead frame is one of the core elements constituting a semiconductor package. It serves as a lead connecting the inner components of the semiconductor package to an outer frame which supports the semiconductor chip. The semiconductor lead frame is generally manufactured by a stamping process where the thin plate material is punched by a press, and by an etching process where local portions of the material are removed using corrosive chemicals.

The semiconductor lead frame manufactured as above can vary in structure depending on the specific layers which are deposited on a substrate. Generally, as shown in FIG. 1, the lead frame is comprised of a pad 11 on which a semiconductor chip (not shown) is mounted, an internal lead 12 which is connected to the chip by wire bonding, and an external lead 13 which is connected to an external circuit.

The semiconductor lead frame described above, when assembled with other components such as a chip, constitutes the semiconductor package. In the semiconductor package, the die pad portion 11 and the internal lead 12 of the lead frame are generally plated by a metal having predetermined characteristics to improve wire bonding between the chip and the internal lead 12 of the lead frame, and between the die attachment of the chip and the die pad portion 11. The external lead 13 is plated with Sn—Pb to improve the solderability of the substrate, after a resin protective film molding process is used.

In the Sn—Pb plating process described above, the plating solution often penetrates into the internal lead 12, so that an additional process for removing that solution is required. A method called a pre-plated frame method is known to solve the problem. In that method, a middle plated section is formed by depositing on the substrate two layers having good solder wettability, prior to processing the semiconductor package.

The plated layer structure formed by the pre-plated frame method is schematically shown in FIG. 2. Referring to FIG. 2, the structure of multi-plated layers is formed by depositing a Ni layer 22 and a Pd/Ni alloy layer 23 as middle plated layers on a Cu substrate 21, followed by a Pd layer 24 deposited on the Pd/Ni alloy layer 23. In the above structure having the plurality of plated layers, the Ni layer 22 prevents Cu atoms of the substrate 21 from generating copper reactants, such as oxides or sulfides, which diffuse to the outermost surface.

When the thickness of the Ni layer 22 is less than 400 μ-inches (about 10.2 μm), layer 22 is porous and allows the Cu atoms to diffuse. When the thickness of the Ni layer 22 is more than 400 μ-inches, a crack can easily be generated when the lead frame is bent.

A method is known for preventing the Cu atoms from diffusing through the porous Ni layer 22 of thickness less than 400 μ-inches, as described above. The structure of the plated layer formed by such method is schematically shown in FIG. 3. Referring to FIG. 3, the multi-plated layers are formed by depositing three middle plated layers on a Cu substrate 31, in the described order. The layers are a Ni strike plated layer 32 about 5 μ-inches thick, a Pd/Ni alloy layer 33 about 3 μ-inches thick, and a Ni layer 34. A Pd layer 35 is then deposited on the Ni layer 34.

However, even in the above structure, reactive copper products such as oxides or sulfides are often found in the outermost surface of the lead frame, thereby causing many problems such as a change in color of the surface and a deterioration of the solderability.

A method for overcoming the problems of the above plated layer structure is known. The plated layer structure formed by that method is shown in FIG. 4. Referring to FIG. 4, the structure of multi-plated layers is formed by depositing in the described order a Ni layer 42, an Au strike plated layer 43, a Pd/Ni alloy layer 44, and a Pd layer 45 as middle plated layers on a Cu substrate 41. An Au layer 46 is then deposited on the Pd layer 45. In the above structure of the plated layers, the Au strike plated layer 43 serves as an adhesive layer between the Ni layer 42 and the Pd/Ni alloy layer 44. The Pd layer 45 serves as a trap of Ni atoms coming from the Pd/Ni alloy layer 44. The outer plated Au layer 46 reduces the porosity and improves the solderability and wire bonding characteristics of the structure. However, this structure has a cost disadvantage due to the plating of the Au layer 46.

In the plated layer structures according to the above-mentioned conventional technology, there is another problem in that the bonding of the middle layer and the outer layer is weak. Due to the weakness of that bonding, the combined portion of the middle layer and the outer layer serves as a crack initiator when bending the lead, and cracks easily form. Partial corrosion is expedited under certain circumstances, thus deteriorating the entire plated layer.

SUMMARY OF THE INVENTION

It is an object of the present invention to provide a semiconductor lead frame with improved wire bonding characteristics, and corrosion durability.

To achieve the above object, there is provided a semiconductor lead frame, according to the present invention, having a multi-plated layer structure, comprising a metal substrate forming a semiconductor lead frame, a Ni alloy plated layer formed on the substrate, a Pd strike plated layer formed on the Ni alloy plated layer, and a Pd—X alloy plated layer formed on the Pd strike plated layer.

In the semiconductor lead frame according to the present invention, the substrate is preferably formed of one of Cu, Cu alloy, and Ni alloy and is preferably formed to have a thickness of 0.1 to 3.0 mm. The Pd—X alloy layer is preferably formed of Pd as a main component and one of Au, Co, W, Ag, Ti, Mo, and Sn. The Pd—X alloy plated layer is preferably formed to have a thickness of 0.1 to 2.0 μm. The Ni alloy plated layer is preferably formed to have a thickness of 0.1 to 2.0 μm. The Pd strike plated layer is formed to have a thickness of 0.005 to 0.05 μm.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

A preferred embodiment of a semiconductor lead frame having a multi-plated layer structure according to the present invention will be described with reference to the attached drawings.

Figure 5:
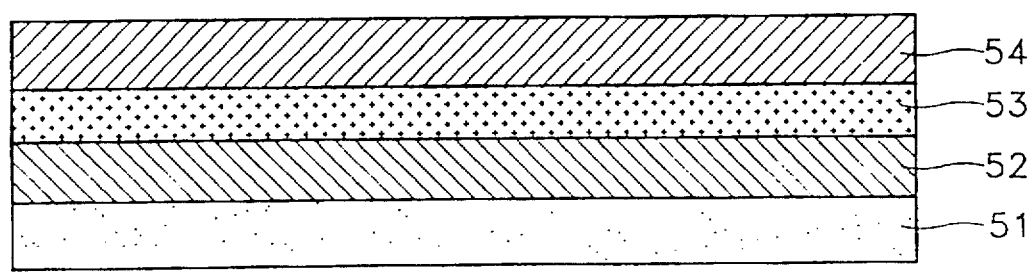
FIG. 5 is a schematic sectional side view showing the plated layer structure of a semiconductor lead frame according to a preferred embodiment of the present invention.

Referring to FIG. 5, the semiconductor lead frame according to the present invention has a structure including multi-plated layers, in which a Ni alloy plated layer 52 and a Pd strike plated layer 53 are deposited as middle plated layers on a metal substrate 51 forming the semiconductor lead frame, and a Pd—X alloy plated layer 54 is deposited on the Pd strike plated layer 53.

Figure 1:
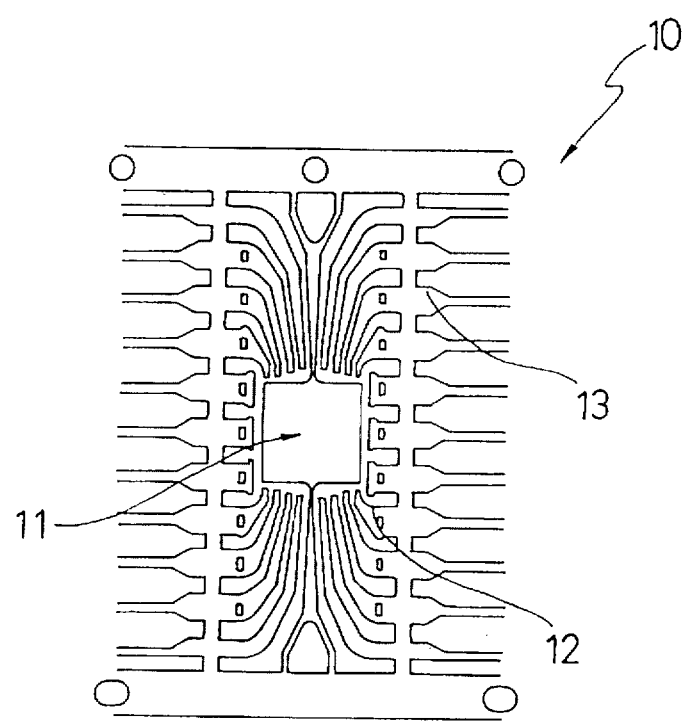
FIG. 1 is a top plan view showing a general semiconductor lead frame.
Figure 2:
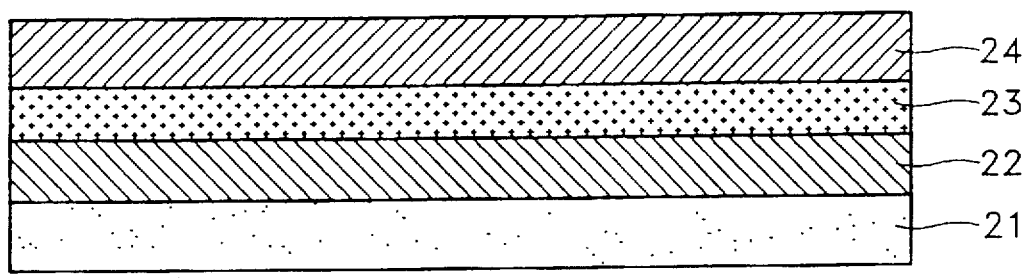
FIGS. 2, 3, and 4 are schematic sectional side views showing examples of a plated layer structure applied to conventional semiconductor lead frames.
Figure 3:
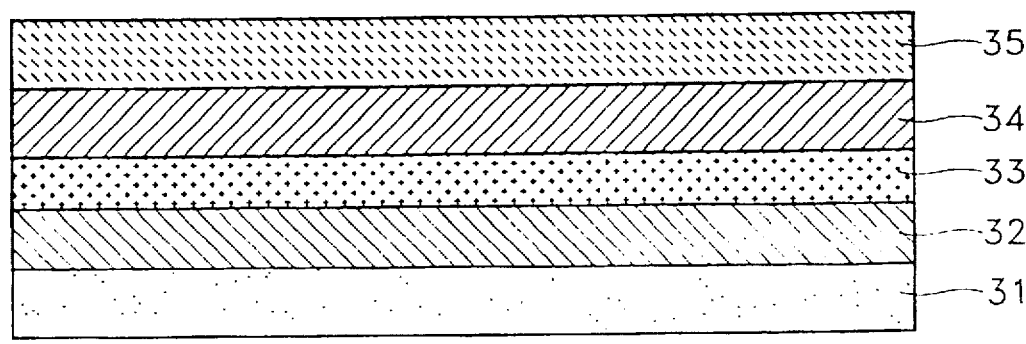
Figure 4:
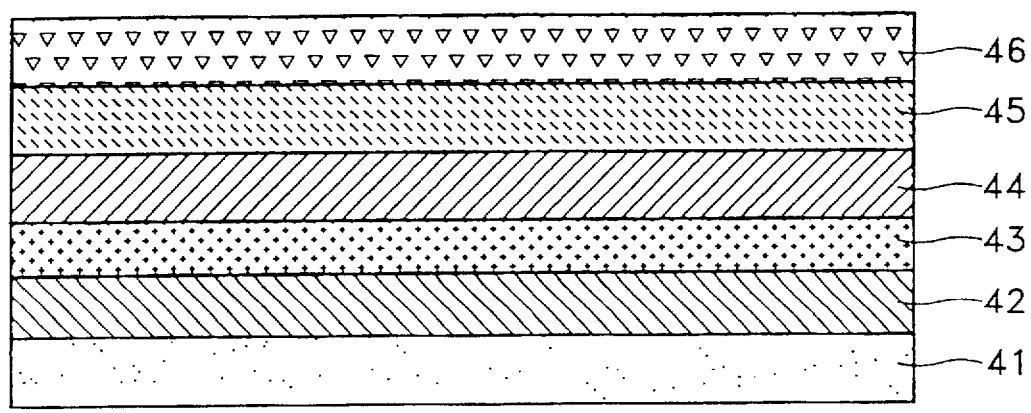

In the above plated layer structure, the substrate 51 is formed of one of the materials, Cu, Cu alloy, and Ni alloy and preferably has a thickness of 0.1 to 3.0 mm. The middle layers include an upper Pd strike plated layer 53, and a lower Ni alloy plated layer 52. The Ni alloy plated layer 52 preferably has a thickness of 0.1 to 2.0 μm, and the Pd strike plated layer a thickness of 0.005 to 0.05 μm. The upper Pd strike plated layer 53 hides the porous surface of the lower Ni alloy plated layer 52, and decreases the surface roughness, resulting in a uniform thickness of the Pd—X alloy plated layer 54 which is electro-deposited on the Pd strike plated layer 53. As a result, the local corrosion typical under a salty atmosphere can be remarkably reduced. The Pd strike plated layer 53 also enhances the bonding force of the Ni alloy plated layer 52 and the Pd—X alloy plated layer 54. Such an enhancement of the bonding force can minimize the generation and progress of the cracks generated by trimming and forming, after loading a semiconductor chip on the pad of the lead frame 11 of FIG. 1. This structure enhances the corrosion durability and prevents the diffusion of the matrix alloy element (for example, Cu) from the substrate 51, and the diffusion of Ni from the Ni alloy plated layer 52. Solderability is thus improved.

The Pd—X alloy plated layer 54 is preferably formed of an alloy composed of Pd as a main component, and of another element such as Au, Co, W, Ag, Ti, Mo, and Sn. The Pd—X alloy plated layer 54 preferably has a thickness of 0.1 to 2.0 μm. The value of the appropriate thickness can change slightly depending on the quantity of alloy composing element X. For example, the thickness of the plated layer 54 preferably decreases as the quantity of X, the alloy composing element, increases. In the present embodiment, a Pd—Au alloy is used as the outer plated layer 54, which improves the bonding force between an Au wire and the Au component which exists in the outer layer 54. This alloy enhances the corrosion durability, since the Pd—Au alloy has a superior corrosion durability than pure Pd. This is because the quantity of hydrogen which diffuses into the outer Pd—Au alloy plated layer 54 is much less than would diffuse into pure Pd. Such diffusion is an important factor in determining the corrosion of the outer plated layer 54 deposited on the Cu lead frame.

In the preferred embodiment, grease removal and activation processing is performed on the surface of the lead frame formed of Cu using Olin-194, which is a product of Yamaha-Olin Metal. The Ni alloy plated layer 52 and the Pd strike plated layer 53 are then sequentially formed, and finally the Pd—Au alloy plated layer 54 is formed, so that the external lead portion has a thickness of about 0.5 μm. The plating solution of Pd—Au alloy used is a Pd-25 wt % Au solution, manufactured by Hanyang Chemical Industrial Co., Ltd. Each plated layer is formed by applying a current of 1.0 A per 2 strips, where a strip refers to the area of one lead frame given in decimeters squared.

The properties of two other comparative configurations were compared to those of the preferred embodiment. In the first comparative configuration, the Ni plated layer was formed by applying the current of 1.0 A per 2 strips using Ni-sulfamate solution on the surface of the lead frame formed from the same material as that of the preferred embodiment. A Pd-plated layer was then directly formed on the Ni layer, without forming the Pd strike plated layer.

In the second comparative configuration, the Ni-plated layer was formed by applying the current of 1.0 A per 2 strips using Ni-sulfamate solution on the surface of the lead frame formed from the same material as that of the preferred embodiment. The Pd—Au plated layer was then directly formed on the Ni layer, without forming the Pd strike plated layer.

The preferred embodiment and the two comparative configurations were subjected to three tests based on U.S. military specifications. The tests were a solderability test, "MIL-STD-883D, Method 2003.7 (solderability)"; a salt spray test, "MIL-STD-883D, Method 1009.8 salt atmosphere(corrosion)"; and a wire bonding test. The results of the tests are outlined in the following table.

TABLE

| Classification | Embodiment | Comparative Config. 1 | Comparative Config. 2 |
| --- | --- | --- | --- |
| solderability | pass | fail | fail |
| bonding force | 12.01g$_f$ | 4.61g$_f$ | 8.40g$_f$ |
| corrosion durability | pass | fail | fail |

Referring to the above table, it is noted that the solderability, corrosion durability, and wire bonding force of the lead frame according to the preferred embodiment of the present invention, in which the Pd strike plated layer 53 is formed between the Ni-plated layer 52 and the Pd—Au plated layer 54, are superior to those of the lead frames of the comparative configurations 1 and 2.

In the lead frame according to the present invention, having multi-plated layers in which the Pd strike plated layer is formed between the Ni plated layer and the Pd—X alloy plated layer, the Pd strike plated layer covers the porous surface of the Ni plated layer and decreases the surface roughness. Since the thickness of the outer Pd—X alloy plated layer can be maintained uniform due to the Pd strike plated layer, the corrosion durability and bonding force is enhanced, thus minimizing the generation and progress of cracks. Therefore, it is possible to promote yield in a semiconductor packaging process by improving the wire bonding characteristics and solderability of the lead frame.

What is claimed is:

1. A semiconductor lead frame, comprising:

a metal substrate forming a semiconductor lead frame;

a Ni alloy plated layer formed on said substrate;

a Pd strike plated layer formed on said Ni alloy plated layer; and a Pd—X alloy plated layer formed on said Pd strike plated layer.

2. A semiconductor lead frame as claimed in claim 1, wherein said substrate is formed of one of Cu, Cu alloy, and Ni alloy.

3. A semiconductor lead frame as claimed in claim 1, wherein said substrate is formed to have a thickness of 0.1 to 3.0 mm.

4. A semiconductor lead frame as claimed in claim 2, wherein said substrate is formed to have a thickness of 0.1 to 3.0 mm.

5. A semiconductor lead frame as claimed in claim 1, wherein said Pd—X alloy layer is formed of Pd as a main component and one of Au, Co, W, Ag, Ti, Mo, and Sn.

6. A semiconductor lead frame as claimed in claim 1, wherein said Pd—X alloy plated layer is formed to have a thickness of 0.1 to 2.0 µm.

7. A semiconductor lead frame as claimed in claim 4, wherein said Pd—X alloy plated layer is formed to have a thickness of 0.1 to 2.0 µm.

8. A semiconductor lead frame as claimed in claim 1, wherein said Ni alloy plated layer is formed to have a thickness of 0.1 to 2.0 µm.

9. A semiconductor lead frame as claimed in claim 1, wherein said Pd strike plated layer is formed to have a thickness of 0.005 to 0.05 µm.

* * * * *